United States Patent
Mandler et al.

(10) Patent No.: US 7,084,935 B2
(45) Date of Patent: Aug. 1, 2006

(54) DISPLAY DEVICE WITH MOLDED LIGHT GUIDE

(75) Inventors: Thomas J. Mandler, Grafton, WI (US); Jason C. S. Lai, Taipei (TW); William J. Latz, Brookfield, WI (US)

(73) Assignee: Adaptive Micro Systems, LLC, Milwaukee, WI (US)

( * ) Notice: Subject to any disclaimer, the term of this patent is extended or adjusted under 35 U.S.C. 154(b) by 110 days.

(21) Appl. No.: 10/608,667

(22) Filed: Jun. 27, 2003

(65) Prior Publication Data

US 2004/0041521 A1 Mar. 4, 2004

Related U.S. Application Data

(60) Provisional application No. 60/406,434, filed on Aug. 28, 2002.

(51) Int. Cl.
*G02F 1/1333* (2006.01)

(52) U.S. Cl. .......................................... 349/58; 349/62

(58) Field of Classification Search .................. 349/58, 349/61, 65
See application file for complete search history.

(56) References Cited

U.S. PATENT DOCUMENTS

| | | | |
|---|---|---|---|
| 4,349,705 A | 9/1982 | Kuhfus | |
| 4,980,568 A | 12/1990 | Merrick et al. | |
| 5,384,459 A | 1/1995 | Patino et al. | |
| 5,555,161 A | 9/1996 | Roe et al. | |
| 5,708,428 A | 1/1998 | Phillips | |
| 5,727,862 A | 3/1998 | Wu | |
| 5,877,863 A | 3/1999 | Ross et al. | |
| 5,951,152 A | 9/1999 | Zabawski et al. | |
| 5,974,213 A | 10/1999 | Maruchi et al. | |
| 6,139,163 A * | 10/2000 | Satoh et al. | 362/612 |
| 6,471,388 B1 | 10/2002 | Marsh | |
| 6,549,179 B1 * | 4/2003 | Youngquist et al. | 345/39 |
| 6,692,137 B1 * | 2/2004 | Blanchard | 362/241 |
| 2001/0046141 A1 | 11/2001 | Walker et al. | |

* cited by examiner

*Primary Examiner*—Andrew Schechter
*Assistant Examiner*—David Y. Chung
(74) *Attorney, Agent, or Firm*—Foley & Lardner LLP (57) ABSTRACT

A display device is disclosed having a base member adapted to receive at least one light device, conductive layer provided on the base member and configured to electrically interconnect with the light device, and a light guide member integrally formed on one or more of the base member and conductive layer, and having at least one aperture configured to at least partially surround the light device. A method of making a display device is also disclosed and includes the steps of providing a base member having a conductive layer provided in a pattern thereon, forming a light guide member having at least one aperture onto at least one of the base member and the conductive layer, and attaching at least one LED to the conductive layer so that the LED is disposed within the aperture.

22 Claims, 6 Drawing Sheets

DISPLAY DEVICE WITH MOLDED LIGHT GUIDE

CROSS REFERENCE TO RELATED APPLICATIONS

The present application claims the benefit of priority as available under 35 U.S.C. 119 (e)(1) of U.S. Provisional Patent Application No. 60/406,434 titled "Display Device" filed on Aug. 28, 2002 (the entire disclosure of which is incorporated by reference).

FIELD

The present invention relates to a display device. The present invention relates more particularly to a molded light guide for use in display devices with printed circuit boards and light sources.

BACKGROUND

The use of optoelectronic devices with light guides for dispersing or focusing the light from bulbs or other light emitting devices is generally known. Such guides may be provided on printed circuit boards having groupings or arrays of LEDs or other light emitting devices for providing displays such a sign or message board assembly. However, the known light guides are often susceptible to problems associated with the physical attachment of the light guide to the printed circuit board. For example, the electrical interconnections between the light source and the circuit board are typically delicate and may be easily damaged through the handling and installation of the light guide onto the circuit board. Also, gaps are often present between the light guide and the circuit board, resulting in leakage of the emitted light along the sides of the circuit board. Also, the application of a molded light guide to a printed circuit board has typically resulted in warping or physical distortion of the assembly. Further, providing an array of LEDs on a printed circuit board and attaching a light guide for use in displays often results in individual LEDs within the array having various degrees of uniformity in color and brightness, thus leading to display images having less uniformity in the optical performance of the device than desired.

Accordingly, it would be advantageous to provide a display device having one or more of the following features alone or in combination with one or more of the other features: a light guide that is molded to a printed circuit board for developing a desired light emission profile, a light guide that is adhered directly to a printed circuit board to minimize light leakage and avoid the use of external attachment devices such as adhesive tape, a light guide that does not require a degassing operation, a light guide that does not result in warping or physical distortion of the assembly, a light guide that provides protection for electrical interconnections and components to create a more robust assembly, a light guide that upon assembly can be separated into individual pixels for matching and grading uniformity and performance of the individual pixels for assembly into a display unit, or a light guide that may be used as an optical coupling device.

SUMMARY

The present invention relates to a display device and includes a base member adapted to receive at least one light device, conductive layer provided on the base member and configured to electrically interconnect with the light device, and a light guide member integrally formed on one or more of the base member and conductive layer, and having at least one aperture configured to at least partially surround the light device.

The present invention also relates to a method of making a display device, the method including the steps of providing a base member having a conductive layer provided in a pattern thereon, forming a light guide member having at least one aperture onto at least one of the base member and the conductive layer, and attaching at least one LED to the conductive layer so that the LED is disposed within the aperture.

The present invention further relates to a molded light guide for a flat panel display device having a base member with at least one light source, the molded light guide comprising a layer of material integrally disposed on the base member and having at least one aperture defining a lighting profile with the light source.

The present invention also relates to a display assembly and includes means for providing a base member made from an insulating material, means for providing at least one light source coupled to the base member, means for integrally forming a light guide member on the base member, and means for providing an electrical connection to the light source.

The present invention also relates to a signal device and includes a base member, a plurality of light sources coupled to the base member, a circuit formed on the base member and electrically interconnected with the plurality of light sources, a light guide integrally formed on the base member and having a plurality of apertures at least partially surrounding the plurality of light sources so that the light source is configured to provide a signal.

The present invention also relates to a signaling system and includes a base member adapted for installation on a vehicle, a plurality of LEDs coupled to the base member, a circuit disposed on the base member and interconnected with the LEDs, and a light guide member formed on the base member and having a plurality of light emission profiles communicating with the plurality of LEDs to provide a signal.

The present invention also relates to an optical coupling device and includes a first coupling portion including a first base member having at least one light transmitting device provided thereon, and a first light guide member integrally formed on the first base member and having at least one aperture configured to at least partially surround the light transmitting device, and a second coupling portion second base member having at least one light receiving device provided thereon, and a second light guide member integrally formed on the second base member and having at least one aperture configured to at least partially surround the light receiving device, so that when the first coupling portion and the second coupling portion are aligned in a substantially facing engagement, a signal may be communicated between the light transmitting device and the light receiving device.

The present invention also related to a pixel for use in a display assembly and includes a base member made from an insulating material, a conductive material applied in a predetermined pattern to the base member to provide a circuit, a light guide member having an opening and integrally formed on at least one of the base member and the conductive material, and at least one light source disposed at least partially within the aperture and coupled to the base member and operably interconnected to the conductive material.

BRIEF DESCRIPTION OF THE DRAWINGS

In the various drawings, like reference numerals are used to indicate like components.

DETAILED DESCRIPTION

Figure 1:
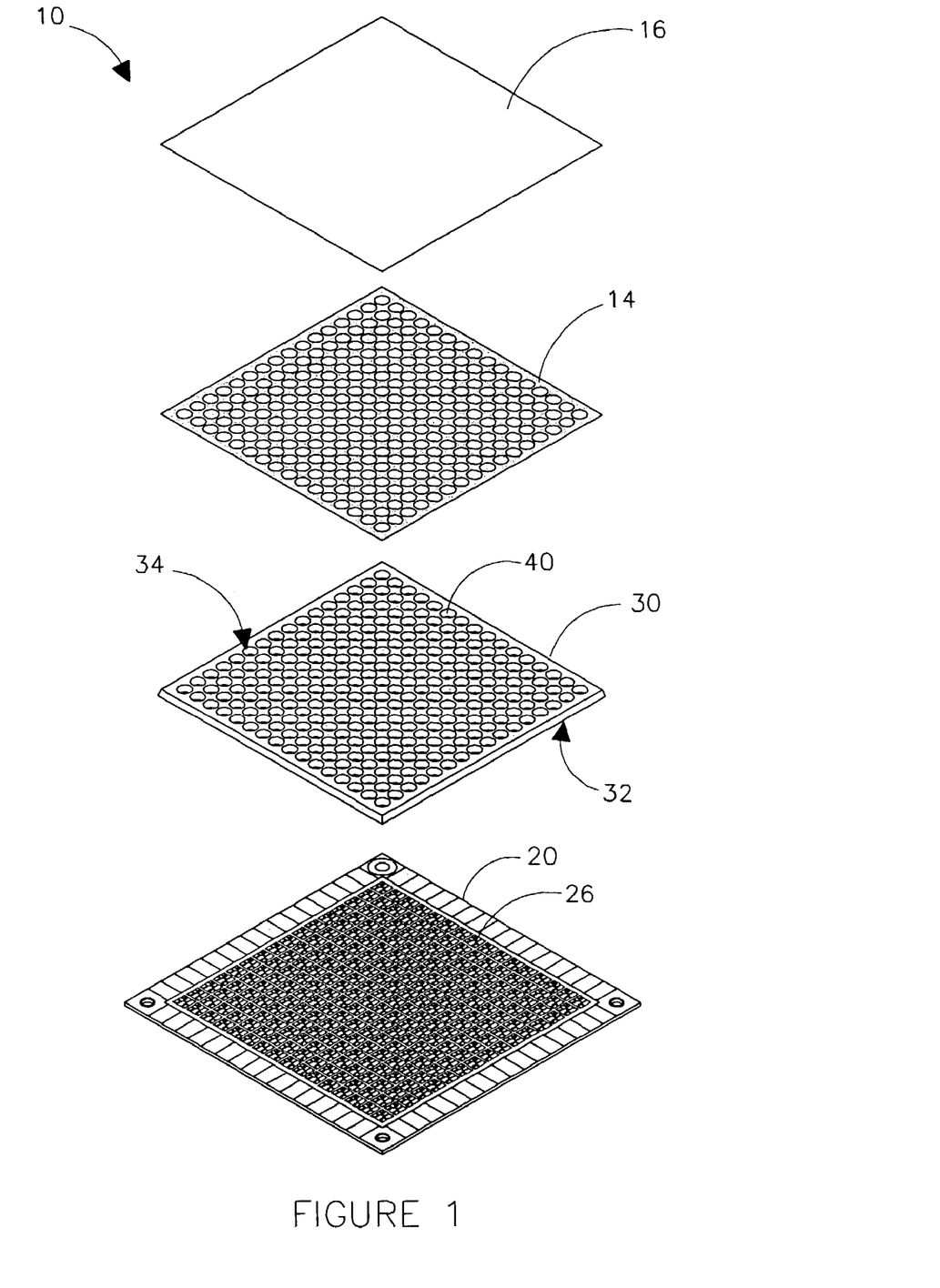
FIG. 1 is an exploded perspective view of a display device according to a preferred embodiment.
Figure 2:
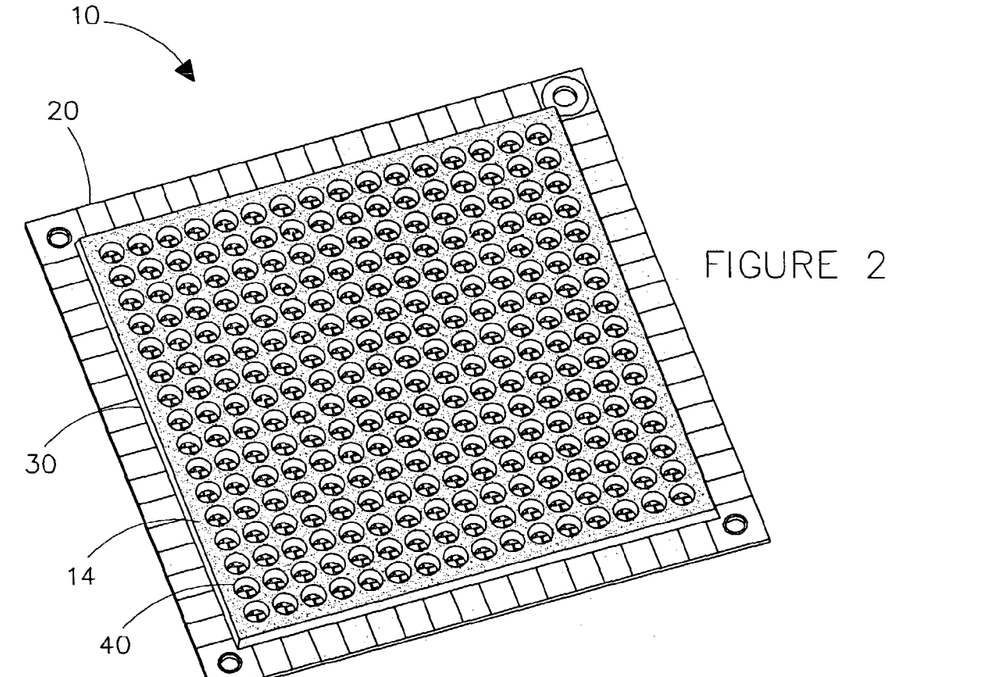
FIG. 2 is a perspective view of a display device according to a preferred embodiment.

Referring to FIGS. 1 and 2, a display device 10 is shown. Display device 10 may be used to transmit light images or information to human observers, such as for use with display assemblies such as signs, message boards, information displays, etc. for providing lighting, alphanumeric messaging, imaging or signaling (e.g. device-to-eye applications). Display device 10 may also be used as an interface to transmit/receive light images or information to non-human observers, such as for use with optical couplers and equipment interfaces (e.g. device-to-device, fiber-to-fiber, fiber-to-device, or device-to-fiber applications). The display device is adapted for use as an assembly that includes an array of pixels (as shown schematically in FIG. 2), and for use as an individual pixel (as shown schematically in FIGS. 5A–5C) or an assembly of individual pixels.

Figure 5A:
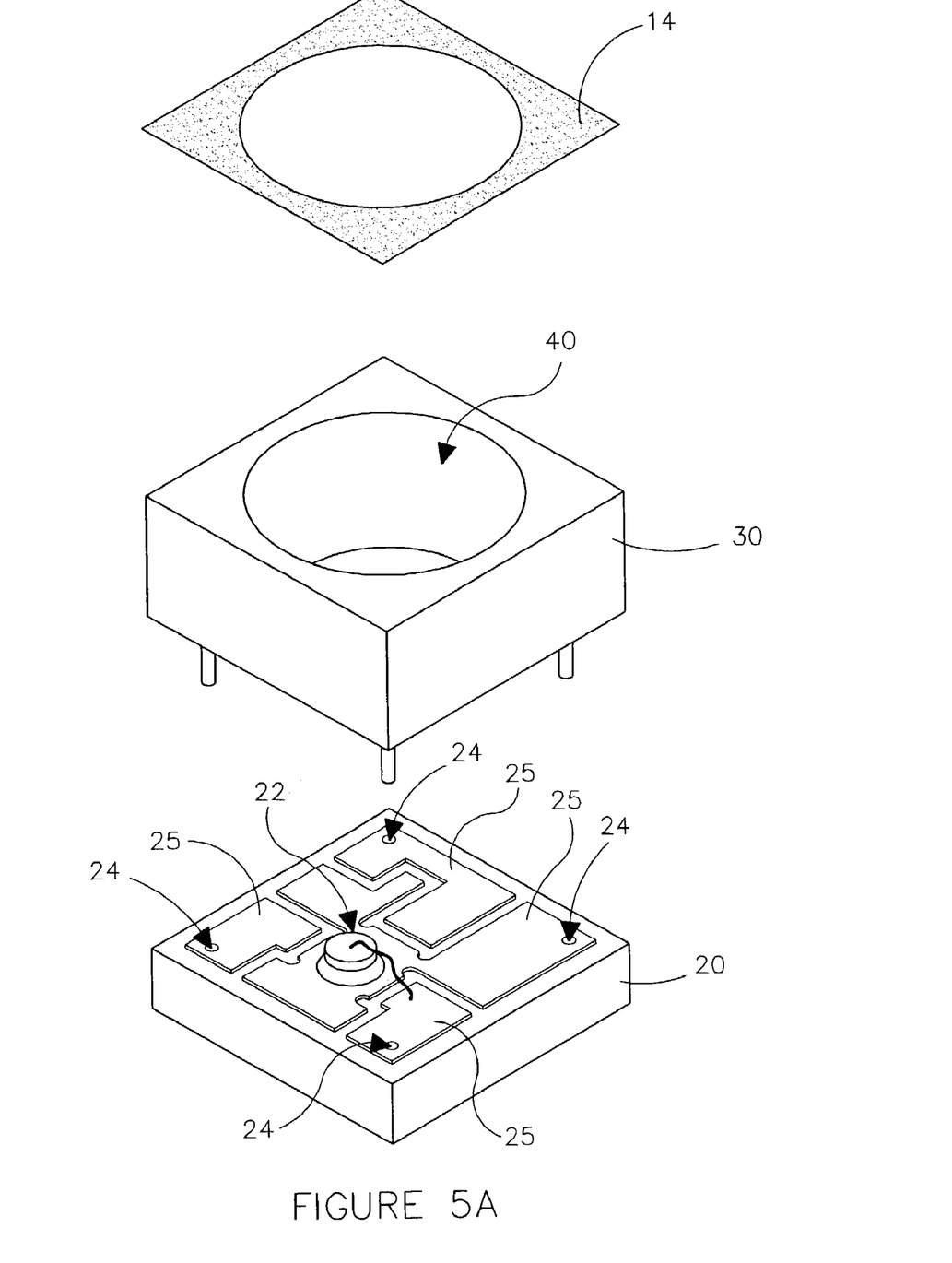
FIG. 5A is an exploded perspective view of a pixel of the display device of FIG. 4 according to a preferred embodiment.
Figure 5B:
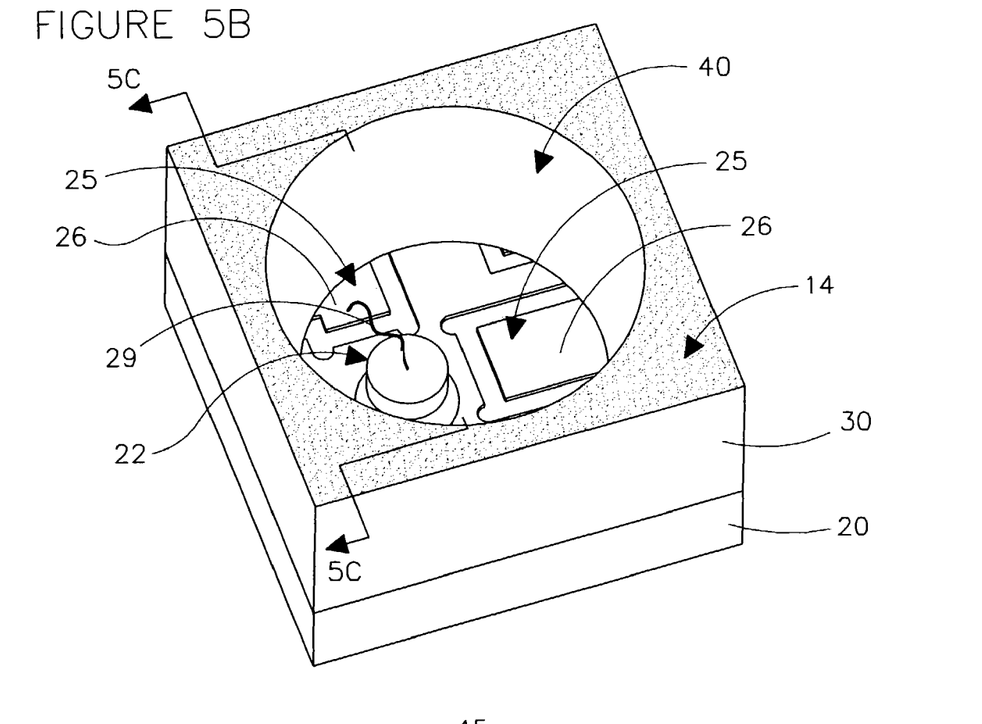
FIG. 5B is a perspective view of a pixel of the display device of FIG. 4 according to a preferred embodiment.
Figure 5C:
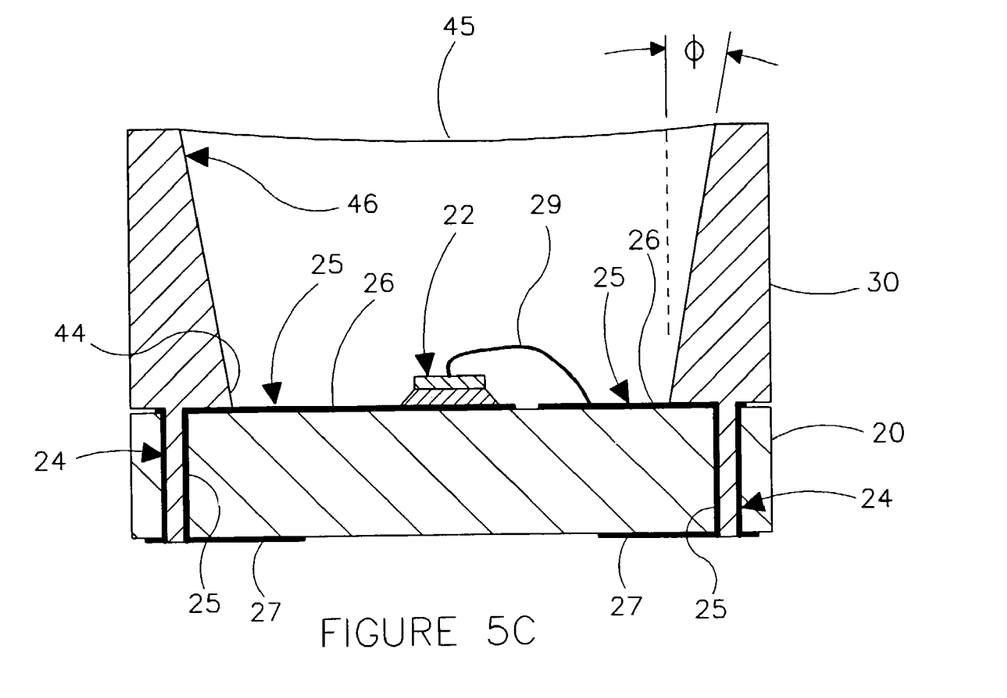
FIG. 5C is a cross-sectional view of an individual pixel of the display device along line 5C—5C of FIG. 5B according to a preferred embodiment.

Display device 10 includes a base member (shown schematically as a substrate material 20), a conductive material provided thereon forming a circuit pattern, light devices 22 such as a light receiving device or a light transmission source (such as a visible light source, shown schematically as LEDs in FIGS. 5A–5C, an infrared light source, etc.) and a guide member (shown as light guide 30) having an inward surface 32 adapted to overlay and be molded onto substrate 20, and including apertures 40 adapted to guide the light emitted from the light source 22 (or received from other sources when used as an optical coupler). A contrast coating 14 is provided on an outward surface 34 of molded light guide 30 to provide a contrasting background to the light source 22. A coating layer 16 (e.g. a seal, sealant, lens, or an optical coating layer having characteristics that are transparent, semi-transparent, colored, etc.) may be provided on the outward surface 34 of molded light guide 30 and contrasting coating 14 to provide a desired optical imaging when viewing display assembly 10. In other embodiments, a potting material (e.g. epoxy, etc.) may be used to fill the volume within the apertures and a coating layer may either be included or omitted. The potting material may be an optical diffusant or a colored material to provide the desired "output" or "input."

Referring further to FIGS. 1 and 2, the substrate 20 has a conductive material 25 (see FIG. 5C) provided thereon (e.g. overlayed, embedded, etc.) to form suitable circuitry 26 for providing electrical conductivity (e.g. anode, cathode, etc.) to an array of light sources (shown schematically as LEDs 22 in FIGS. 5A–5C) that are positionable on the conductive material of substrate 20. Each light source may be a single light source or may be a plurality of light sources (e.g. multiple LEDs, etc.). The conductive material may be gold, silver, aluminum, or other suitable conductor for providing circuitry on the substrate. Light sources 22 may be formed of any suitable material to provide light of various colors and intensities suited for the intended application. The light sources may also be configured and controlled to combine or mix the color of the light emitted to provide other light colors.

In a preferred embodiment, the light sources are LEDs that are provided in a sixteen (16) by sixteen (16) array and the substrate is approximately seventy-one millimeters in length and approximately seventy-one millimeters in width, with a thickness of approximately 0.5 millimeters. The LEDs are attached to the conductive material 25 of substrate 20 by a die attachment method, such as with silver epoxy conductors, or by other suitable methods. The LEDs may be discrete color LEDs configured to emit light in a single color (e.g. monochromatic), such as white, red, green or blue, or multicolor LEDs (e.g. red, green and a mixture of red and green to create amber) or may be any suitable combination of LEDs of individual colors to provide the desired display image on display device 10. In a preferred embodiment, substrate 20 is made of a ceramic material for providing electrical insulation for circuitry 26 and to provide suitable heat transfer for heat generated by the light sources, but may be made of any suitable material such as phenolic, fiberglass, paper or other conventional types of materials commonly used in circuit board applications. The substrate 20 includes interfaces (shown schematically as openings or cylindrical apertures 24 in FIG. 5C) positioned around the LEDs 22 and extending through conductive material 25 and substrate 20. The conductive material 25 extends along a wall of cylindrical apertures 24 to provide electrical continuity to conductive pads 27 located on the bottom of substrate 20 (see FIG. 5C). The conductive pads 27 are positioned to provide electrical contacts suitable for engaging other circuit components (e.g. of a conventional type) for use with the display device such as printed circuit boards, etc. for communicating with the light source on the top of the substrate. Cylindrical apertures 24 also provide structure intended to enhance securing the light guide 30 to the substrate 20 (to be further described). In a preferred embodiment, the cylindrical apertures 24 are provided as four apertures that are spaced around the outside of each light source. The LEDs may be any conventional LED adapted for mounting on a substrate and may be provided in any suitable color to provide the intended optical image from the display device. In alternative embodiments, the substrate may have any suitable size, shape (e.g. rectangular, etc.), thickness and any suitable number of LEDs or other light sources such as infrared may be provided in any pattern desired to suit the intended display device application.

Figure 3A:
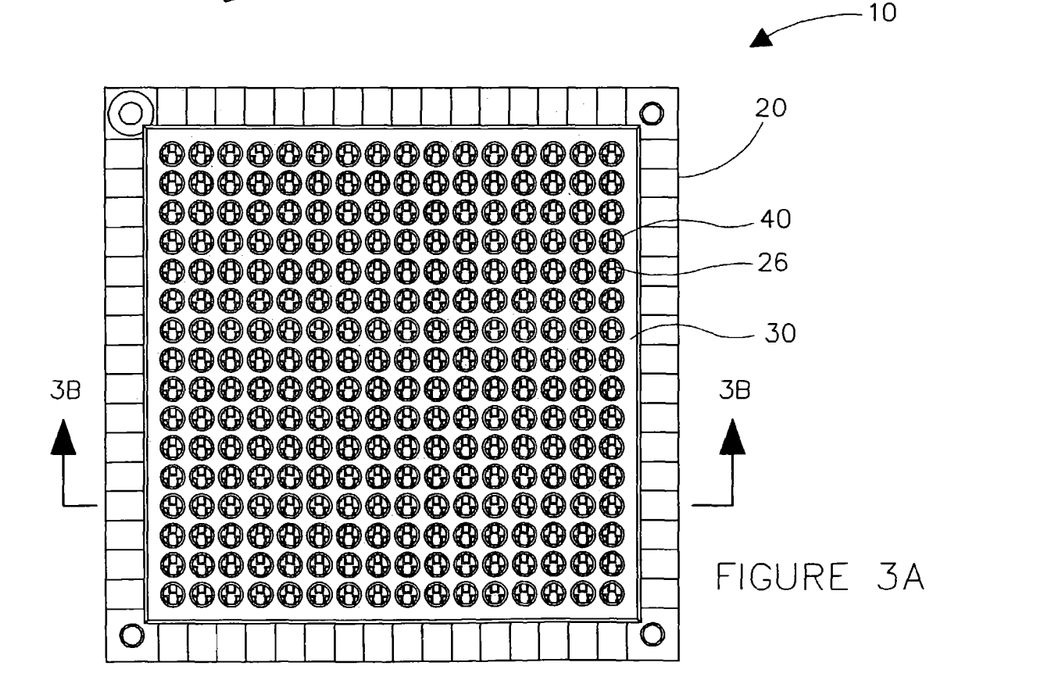
FIG. 3A is a top view of a display device according to a preferred embodiment.
Figures 3B, 4:
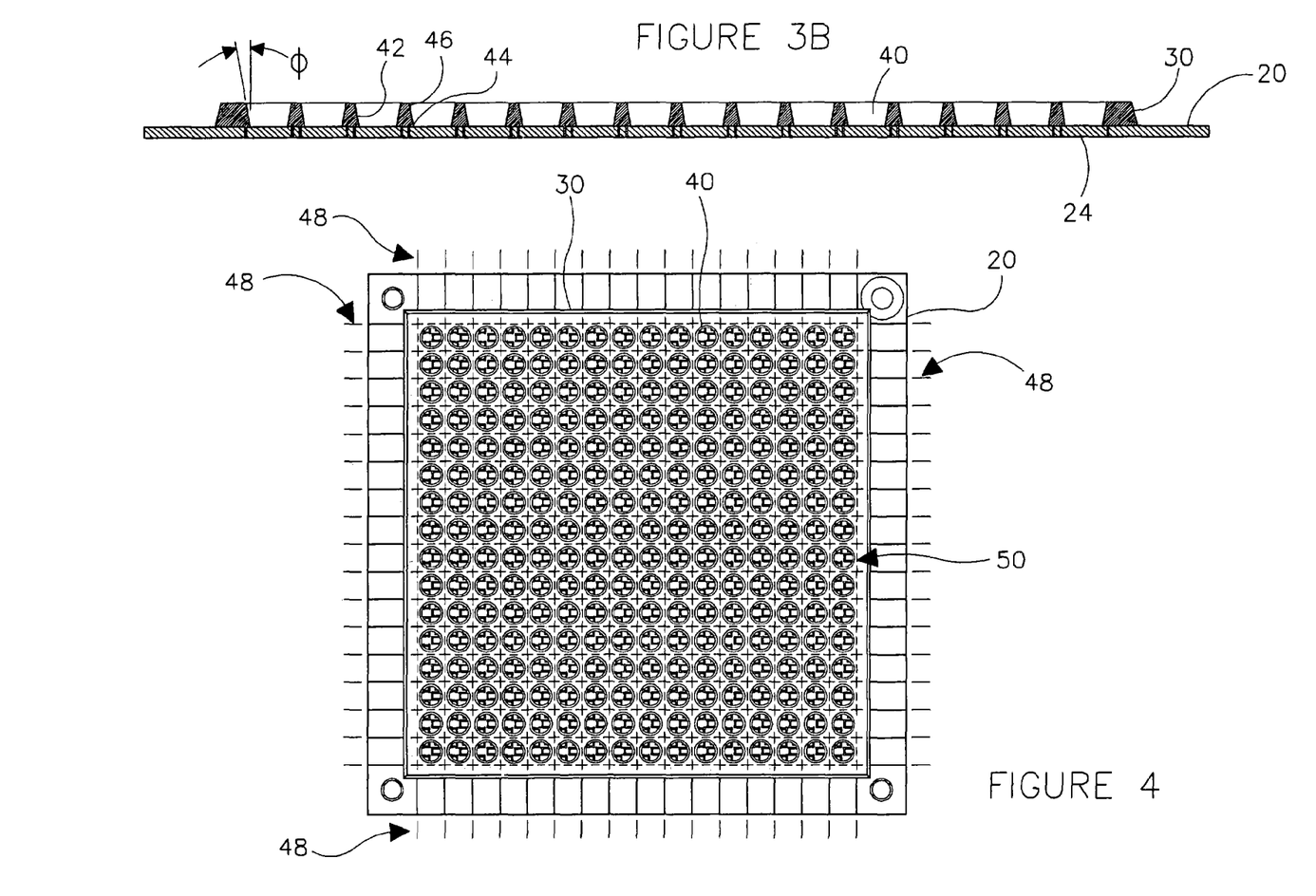
FIG. 3B is a cross section view of the display device along line 3B—3B of FIG. 3A, according to a preferred embodiment.
FIG. 4 is a top view of a display device separated into pixels according to a preferred embodiment.

Referring further to FIGS. 3A–3B, the light guide 30 is shown as a generally planar member having an array of apertures 40 positioned to correspond to the location of the light sources such as LEDs 22 on the substrate 20, such that each LED is surrounded by an aperture 40 on the light guide 30. The light guide 30 is made of a material such as a plastic-based material that may be formed in a suitable molding process and provides the desired light reflection or absorption qualities for the intended display application. The light guide material is selected to provide suitable performance characteristics such as a melting point greater than the heat generated by the light source so that the light guide material will not deform during operation. In a preferred embodiment, the light guide 30 is formed by molding the light guide material onto the surface of the substrate 20 and conductive material 25, whereby the light guide material enters or "flows" into the cylindrical apertures 24 on the substrate 20 to enhance securing the light guide 30 onto the substrate in the vicinity of each of the light sources. Application of the light guide material directly on to the substrate is intended to provide a seal between the light guide and substrate (e.g. a hermetic seal, etc.). In a particularly preferred embodiment, the light guide material is plastic having a generally white color that is formed onto substrate 20 in an injection molding process, such that the thickness of the light guide is approximately one (1) millimeter. In an alternative embodiment, the light guide may be secured to the printed circuit board using other configurations, such as structure (e.g. ribs, ridges, posts, etc.) extending from the printed circuit board, or a light guide material that adheres to the surface of the substrate, or adhesive, etc. In other alternative embodiments, the light guide may be formed of other material compositions and colors, in any desired thickness, or by other suitable molding processes.

Referring further to FIGS. 3A–3B, the apertures 40 in the light guide 30 are formed with a side wall 42 to create a light emission profile configured to guide or focus the light emitted from each of the light sources. In a preferred embodiment, the light emission profile of the side wall 42 is in the shape of a truncated cone with a first (e.g. "narrow") portion 44 having a diameter of approximately 2.4 millimeters and oriented inwardly and surrounding the LED 22, and a second portion (e.g. "wide") 46 having a diameter of approximately 3.2 millimeters and oriented outwardly, where the side wall 42 forms an angle $\phi$ from a reference line extending perpendicularly outwardly from the printed circuit board 20. The angle $\phi$ may be formed at any suitable angle to provide the desired emitted light leakage quantities and peripheral readability characteristics for the intended display device application. The shape of the light emission profile of side wall 42 and the angle $\phi$ are selected to optimize the emission of light for a particular application. For example, angle $\phi$ may be relatively narrow for non-visible light applications (e.g. infrared, etc.) and may be relatively wider for visible light applications. In a particularly preferred embodiment, the angle $\phi$ is approximately within the range of 20–25 degrees, but may be within any suitable range to optimize the emission of light for an application. The shape of the light emission profile of the side walls may be in shapes other than a truncated cone. For example, the light guide may be formed with side walls having a parabolic shape (e.g. cup-shape, etc.) to provide increased or modified reflective light emission or to provide a desired light reflection pattern. For example, the pattern may be adjusted to increase the light signal to noise ratio, or reduce the light signal to noise ratio, or to minimize crosstalk or interference of the light signals from adjacent light sources. In an alternative embodiment, the shape of aperture may be non-circular (e.g. oval, elliptical, etc.) to provide the desired light transmission or reception profile.

The space within the aperture 40 may be unfilled (e.g. air space), or may be filled with an encapsulating or fill material (e.g. potting, etc.) for sealing and enhancing the optical image (e.g. intensity, color, color mixing, etc.) of light source 22. In a preferred embodiment, a fill material 45 shown schematically as a clear epoxy is provided that enhances the durability of the display assembly 10 and provides the desired optical emission of light from the light source. The fill material may be allowed to cure under ambient conditions or may be oven-cured to expedite manufacturing processing time. The fill material may result in a surface that is concave (as shown schematically in FIG. 5C) or may be generally flat of convex, as necessary to provide the desired optical performance. According to any preferred embodiment, the seal provided between the light guide and the substrate permits the fill material to be applied from the outward surface 34 (e.g. "front") of light guide 30, rather than applying the fill material from an inward (or "back") side of the light guide as is typically necessary in conventional display applications. In an alternative embodiment, the apertures may have side walls configured at other angles suitable for providing the desired light emission qualities, or the side walls may be formed in a cupped or parabolic shape, and the fill material may be any suitable material for encapsulating the light source within the aperture and may be provided in any suitable color for providing the desired optical image. In another alternative embodiment, the light guide may also be adapted for use in applications where light is received by the circuitry on the substrate. For example, the light guide may be applied over a substrate or printed circuit board that is adapted to interface with light signals from a source (e.g. from fiber optic sources, etc.), in which the aperture acts as a lens to direct light from the source to the printed circuit board.

Referring to FIGS. 1 and 5A, a contrast coating 14 (e.g. a layer or film of ink or other suitable pigment or coloration, etc.) may be provided on the outward surface of the light guide 30 according to a preferred embodiment. The contrast coating 14, if used, is applied to the surface of the light guide 30 to provide a contrasting background for viewing the light images emitted from the light source(s) 22 (shown as LEDs) on the display device 10. Contrast coating 14 may be applied in any conventional manner such as screen printing and provided in a color such as black, or other suitable contrasting color to suit an intended display application. Another coating 16 (e.g. tape layer, adhesive panel, lens, etc.) may be provided over the contrast coating 14 to seal the apertures 40 and to improve optical uniformity of the light emitted from the light source. Such coating 16 may be substantially transparent, such as for single LED or may be semi-transparent, such as for a multicolor LED or for multiple single-color LEDs to provide a color-blending effect. Coating 16 may also be provided in various colors to act as a lens through which the emitted light from the light source is viewed. The assembled display device 10 provides a plurality of individual cells or pixels 50 (shown schematically in FIG. 4B) that are formed by the light source 22 (shown as LEDs) and the respective portions of the substrate 20, conductive material 25, light guide 30, contrasting coating 14 and coating 16. In an alternative embodiment, the contrast coating and the top coating may be combined into a single coating layer for application on the light guide. In another alternative embodiment, the contrast coating may be applied by other methods such as inkjet printing, screen printing or digital printing.

Referring to FIGS. 2 and 4, the display device 10 may be used as a single component or separated into multiple display components according to a preferred embodiment. As shown in FIG. 2, the assembled display device may be used as a single display assembly and may be provided in a sufficient size with a sufficient number of LEDs to suit a particular display device. Display device 10 may be made as a large unit or board and segregated into smaller elements for use in smaller sign or display applications.

Referring to FIG. 4, the display device 10 may be separated into smaller groups of pixels or into individual pixels by separating the display device 10 into subgroups of pixels or into individual pixels. The components of the display device may be made in any suitable size to provide pixels having any desired size, intensity, and light transmission/reception characteristics. In one embodiment, the pixels are separated by cutting the display device 10 along one or more lines 48 between the apertures 40. Such cutting of the display device 10 into individual pixels or groups of pixels may be performed by a dicing saw having a diamond cutting wheel in a semi-automatic or fully automated operation, or the cutting operation may be accomplished by a laser cutting techniques. In an alternative embodiment, the pixels may be separated into subgroups or individual pixels by any suitable non-destructive separation or cutting operation that does not damage the pixels.

Referring to FIGS. 5A–5C an individual pixel of a display device is shown according to a preferred embodiment. The pixels include a corresponding portion of the substrate 20, the conductive material 25, the light guide 30, the light source 22 (shown as an LED), an encapsulating material 45, the contrast coating 14 and (if provided) a coating 16. As shown in FIGS. 1 and 5C, substrate 20 has a conductive material 25 on a top surface that provides conductive regions (e.g. traces, patterns, etc.) of circuitry 26 for providing conductivity with the light sources 22 (shown as LEDs). The conductive material on the top of the substrate extends through aperture 24 and provides continuity with conductive pads 27 on the bottom of substrate 20. In a preferred embodiment, four apertures 24 are configured at each corner of the pixel and are each configured to provide continuity to one of four conductive pads at the corners of the pixel that correspond to four conductive regions of circuit 26 for use with three individual LEDs provided as a light source. Each LED is electrically interconnected to the appropriate regions of circuit 26. In a preferred embodiment the anode of each LED is attached to a respective conductive region of circuitry 26 by silver epoxy and the cathode of each LED is attached by a wire 29 to a common conductive region of circuitry 26. The conductive regions of circuitry 26 may be configured for placement of the light source(s) approximately at the center of aperture 40 of the light guide 20 to provide improved optical performance of the display device. Placement of the light source(s) at the approximate center of the light guide also tends to minimize the length of the wires used for electrical interconnection of the light source(s), which is believed to reduce the tendency of the wires to break during high temperature application or usage. The placement of the light source within aperture 40 may be substantially non-centered for applications as necessary to develop desired light emission or reception profiles. Conductive pads 27 provide contact locations for suitable connecting circuitry used to control (e.g. drive, modulate, etc.) the light sources (such as by printed circuit boards, etc.).

In a preferred embodiment, the individual pixels 50 are individually tested and graded according to established operating criteria and performance standards (e.g. conductivity, brightness, color, clarity, etc.) and "binned" or segregated into groups having like or similar performance characteristics. The segregated groups of pixels may then be used to assemble signs, displays or message boards comprised of individual pixels having relatively uniform and consistent display characteristics, or for positioning lower grade pixels in certain areas of the sign, display or message board that are more optically or aesthetically acceptable. The segregated groups of pixels may also be assembled into graded pixels blocks (having any suitable number of pixels of like or otherwise desirable performance characteristics) that may then be assembled as components of larger signs, displays or message boards having the desired pixel performance and display qualities. Such separated display device portions, individual pixels or pixel blocks may be used for rapidly assembling custom-order signs, displays or message boards without having to specially create a new display device for each new application.

Display device 10 may be formed as an individual unit for use in various LED display devices, alphanumeric message boards, signs, etc. including (by way of example) taxiway signs or signs for transportation depots or facilities (e.g. airports, railway stations, bus stations, ports, highways, etc.), having suitable software for displaying multilingual messages, retrofit LED display boards for drop-in display modules that replace or supplement conventional display signs or provide enhanced messaging or imaging capability with existing displays in commercial (restaurants, stores, shopping centers, etc.), industrial (factories, offices, manufacturing and assembly facilities, etc.), institutional (schools, libraries, hospitals, etc.) or governmental facility signage or display applications. Such display devices may also be used in one or more arrays for residential applications, such as to provide lighting (e.g. normal or emergency), in which the circuitry is suitably coupled to a circuit device (not shown) for converting standard residential electrical power, such as 120 volts AC and 60 hertz, or from a back-up source, to a suitable power level adapted for use by the display device.

The structure of the display device may be used in other applications for transmitting and receiving light. For example, the light guide may be used as an integral component with any optoelectronic device. The light guide, substrate, and suitable circuitry may be configured as mating halves of a coupler (e.g. plug, connector, interface, etc.) for coupling, modulating or amplifying light signals between various devices. For example, a "plug" having suitable light transmission or receiving structure, or electrical conductivity device, may be molded onto the top or bottom of the display device and configured to interconnect with other pugs or devices. The light guide may also be used with suitable substrates and circuitry for night vision applications and for coupling of fiber optic devices. In fiber optic applications, the light guide may be used as an optical coupler for use in "plugs" or connectors configured to fit together for transmitting and receiving light signals among various equipment.

Display device 10 may also be used for upgrading existing displays or signage or for providing additional display capabilities by sizing the display assembly 10 for use as a "drop-in" replacement for an existing sign, panel or display, particularly in applications that would otherwise require application for a new "permit" or other authorization where necessary for use of a new or replacement sign or display. Additionally, multiple display assemblies may be grouped together and coordinated with suitable messaging or imaging software to provide alphanumeric or imaging displays (e.g. single color or multicolor) for large scale signs, such as (by way of example) large display applications including stadium scoreboards, electronic billboards, video devices, viewing screens and the like.

Figure 6:
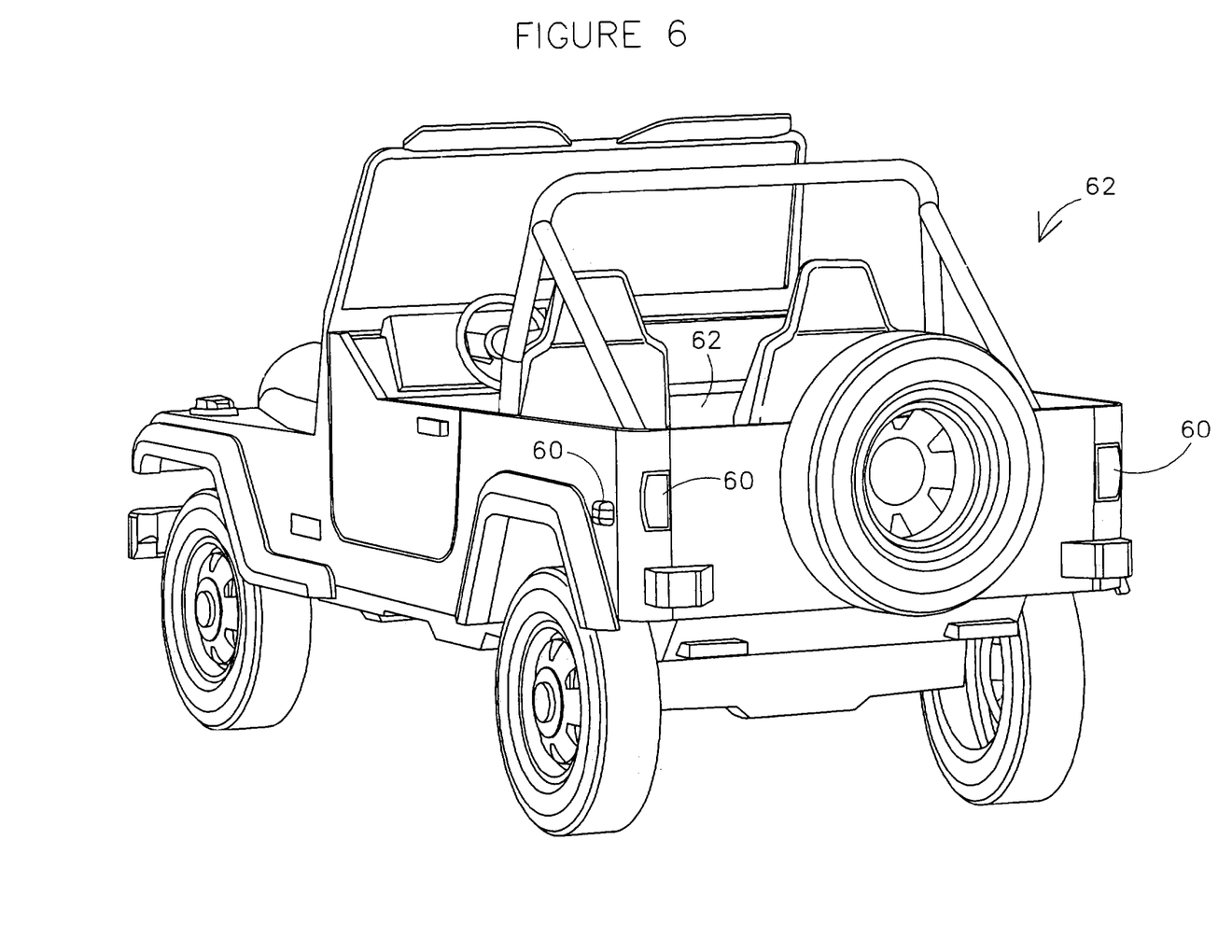
FIG. 6 is a rear perspective view of an application of the display device according to a preferred embodiment.

Referring to FIG. 6, display device 10 may further be used to provide signal devices (shown schematically as a vehicle signal 60 for a vehicle 62, but may include other signal applications such as airport runway signals, highway traffic signals, railway crossing signals, other visual indication signals, etc.). Such signals may be provided with, or assembled from pixels or pixel arrays having, various LED configurations adapted to emit light having different colors according to the different functions of the signal. In one embodiment, signal 60 includes, or is coupled to, control circuitry (not shown) of a type that is responsive to a vehicle user's actions to actuate the signal 60 to emit light from LEDs 22 in a first color (e.g. red) during braking, or a second color (e.g. amber) during turn-signaling or hazard signal operation, or a third color (e.g. white) during operation of vehicle 62 in a reverse direction. The control circuitry may be configured such that signal 60 may provide indication for one or more functions separately and may also be configured to provide indication for one or more functions simultaneously. For example, signal 60 may indicate multiple functions simultaneously by alternating the emitted light color according to the corresponding functions on a predetermined time interval, or the display of the signal 60 may have several portions, each configured to provide indication of a particular function. Alternatively, signal 60 may indicate multiple functions simultaneously by alternating the emitted light color of certain groups of the LEDs 22 on the display device 10 to create a desired pattern for a first function, such as a directional signal, interposed on a desired pattern for a second function such as a brake signal. In a similar manner, multi-portion traffic lights may be replaced with a single portion having an array of multicolor LEDS or a range of discrete color LEDs. This arrangement would permit merely changing the color portion rather than having three separate portions as are currently used. This arrangement would also permit displaying an alphanumeric message or graphic image in the traffic light signal display portion.

Signal 60 according to the embodiment may be provided as a substantially flat panel display device adapted for installation on a surface, such as a vehicle panel 64, without the necessity for wells, recesses or compartments in the body of vehicle 62 as are typically required for conventional vehicle signal devices. Such surface installation may provide increased space within the interior of vehicle 62 and reduce the complexity and time associated with vehicle panel forming operations and assembly activities. Of course, signal 60 could be positioned in a similar manner as are conventional light bulbs by placing them in a housing under a lens or transparent cover.

According to any preferred embodiment, the display device includes a substrate material (such as ceramic, etc.), having a conductive material (such as gold, etc.) provided thereon in a suitable pattern to provide a circuit board configured to interface with one or more light sources and a control circuit (e.g. external). A moldable material is molded onto one or both of the substrate and conductive material to provide a light guide that surrounds a portion of the circuitry that is adapted for mounting one or more light sources thereon. The substrate may have suitable structure (such as apertures) intended to improve the adhesion of the light guide to the substrate. One or more light sources (such as LEDs) are installed on the substrate and electrically interconnected to the appropriate portions of the circuitry (e.g. by conductive epoxy, wires, etc.). If desired, the light sources may be encapsulated within the light guide by a suitable material (e.g. epoxy, etc.).

According to any preferred embodiment, the display device may be manufactured by providing a substrate material, providing a conductive overlay material to form the desired circuit patterns thereon, molding a light guide onto the substrate and conductive material, installing the light source(s) on the appropriate portion(s) of the circuit patterns, installing the electrical interconnections between the light source(s) and the appropriate portion of the circuit pattern, encapsulating the light source(s) within the light guide. If desired, the display device can be separated (e.g. cut, sawed, diced, etc.) into individual pixels that may be graded and "binned" for use in assembling graded pixel blocks. The formation of the light guide on the substrate and/or the conductive material prior to installing and electrically interconnecting the light source(s) is intended to improve the durability and ruggedness of the device. Further, the installation of the encapsulating material after electrical interconnection of the light sources is also intended to improve the durability and ruggedness of the device.

It is important to note that the construction and arrangement of the elements of the display device provided herein are illustrative only. Although only a few exemplary embodiments of the present invention have been described in detail in this disclosure, those skilled in the art who review this disclosure will readily appreciate that many modifications are possible in these embodiments (such as variations in installation location and orientation, sizes, structures, shapes, angles and proportions of the various elements, mounting arrangements, use of materials, combinations of shapes, etc.) without materially departing from the novel teachings and advantages of the invention. For example, the light guide may be used in any application for directing, focusing or dispersing the light emitted from a display, sign, message board or other light transmitting or receiving system. Also the light guide may have any suitable shape, length, thickness, location or orientation for use in connection with manufacturing large arrays of light sources such as, but not limited to, LEDs and separating the large array into groups of smaller arrays. Additionally, the light guide may be used with any suitable light emitting device surface other than printed circuit boards having LEDs. The light guide may be used to control the outward emission of light from the LEDs, or may be used to receive light from a source (e.g. fiber optics source, etc.) configured to interface with a printed circuit board. Further, it is readily apparent that the light guide may be provided in a wide variety of shapes, sizes, thickness, and light distribution profiles and adapted for installation on any size printed circuit board. Additionally, the sign, message board, imaging screen or information display may be any display adapted to visually convey alphanumeric messages, signals, information or images for use in original design applications or for use in retrofit applications for replacing, enhancing or upgrading existing signs or display devices. Accordingly, all such modifications are intended to be within the scope of the invention.

While the present invention has been described in connection with a particularly preferred embodiment thereof, the invention is not to be limited by the drawings. The order or sequence of any process or method steps may be varied or re-sequenced according to alternative embodiments. In the claims, any means plus-function clause is intended to cover the structures described herein as performing the recited function and not only structural equivalents but also equivalent structures. Other substitutions, modifications, changes and omissions may be made in the design, operating configuration and arrangement of the preferred and other exemplary embodiments without departing from the spirit of the inventions as expressed in the appended claims.

What is claimed is:

1. A method of making a display device, the method comprising:
   providing a base member having a conductive layer provided in a pattern thereon;
   forming a light guide member having at least one aperture onto at least one of the base member and the conductive layer; and
   coupling at least one LED to the conductive layer so that light emitted from the LED is directed outwardly from the aperture.

2. The method of claim 1 further comprising the step of applying a contrasting coating on the light guide member.

3. The method of claim 1 further comprising the step of applying an optical coating on the light guide member.

4. The method of claim 1 further comprising the step of filling the aperture with a fill material.

5. The method of claim 4, further comprising the step of curing the fill material.

6. The method of claim 1 further comprising the step of separating the base member, the conductive layer and the light guide member into a plurality of pixels.

7. The method of claim 6 wherein the step of separating comprises use of a dicing saw.

8. The method of claim 6 further comprising the step of evaluating the pixels in accordance with at least one performance criteria.

9. The method of claim 8 further comprising the step of segregating the pixels according to the performance criteria into at least one graded category of the pixels having performance characteristics representative of the performance criteria.

10. The method of claim 9 further comprising the step of assembling the pixels from the graded category into a display assembly.

11. The method of claim 1 wherein the base member includes at least one opening and the step of forming a light guide includes forming a light guide material in communication with the opening.

12. A display device made according to the method of claim 1.

13. A method of making a display device, the method comprising:
   providing a base having a conductive layer provided in a pattern thereon;
   forming a light guide having at least one aperture onto at least one of the base and the conductive layer;
   coupling at least one LED to the conductive layer so that the LED is disposed within the aperture; and
   separating the base, the conductive layer and the light guide into a plurality of pixels.

14. The method of claim 13 further comprising the step of evaluating the pixels in accordance with at least one performance criteria.

15. The method of claim 14 further comprising the step of segregating the pixels according to the performance criteria into at least one graded category of the pixels having performance characteristics representative of the performance criteria.

16. The method of claim 15 further comprising the step of assembling the pixels from the graded category into a display assembly.

17. A display device made according to the method of claim 13.

18. A method of making a display device, the method comprising:
   providing a base having a circuit thereon, the base including at least one opening;
   forming a light guide having at least one aperture from a material, the material disposed on at least one of the base and the circuit and extending at least partially into the opening; and
   coupling at least one LED to the circuit so that the LED is disposed within the aperture.

19. The method of claim 18 wherein the material extending at least partially into the opening is arranged to secure the light guide to the base.

20. The method of claim 18 further comprising the step of filling the aperture with a fill material.

21. The method of claim 18 wherein the circuit is operable to illuminate the LED.

22. A display device made according to the method of claim 18.

* * * * *